United States Patent
Modaffari et al.

(10) Patent No.: US 11,716,061 B2
(45) Date of Patent: Aug. 1, 2023

(54) MULTI-STAGE AMPLIFIER CIRCUITS AND METHODS

(71) Applicant: STMicroelectronics S.r.l., Agrate Brianza (IT)

(72) Inventors: Roberto Modaffari, Pallanzeno (IT); Germano Nicollini, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/665,399

(22) Filed: Feb. 4, 2022

(65) Prior Publication Data

US 2022/0263481 A1     Aug. 18, 2022

(30) Foreign Application Priority Data

Feb. 15, 2021   (IT) .................. 102021000003350

(51) Int. Cl.
*H03F 3/45*     (2006.01)
*H03F 3/70*     (2006.01)

(52) U.S. Cl.
CPC ..... *H03F 3/45273* (2013.01); *H03F 3/45269* (2013.01); *H03F 2203/45526* (2013.01)

(58) Field of Classification Search
CPC ............. H03F 3/45273; H03F 3/45269; H03F 2203/45526; H03F 3/45188; H03F 3/45475; H03F 2203/45544; H03F 3/45183; H03F 3/45659; H03F 1/26; H03F 1/301; H03F 3/45179; H03F 2200/372; H03F 2200/447
USPC ........................................ 330/252–261, 310
See application file for complete search history.

(56) References Cited

U.S. PATENT DOCUMENTS

| | | | | |
|---|---|---|---|---|
| 6,265,941 B1 * | 7/2001 | Lopata | ................ | H03F 3/45807 330/258 |
| 6,963,245 B2 * | 11/2005 | van Engelen | ....... | H03F 3/45659 330/253 |
| 8,854,136 B2 * | 10/2014 | Cavallaro | ........... | H03F 3/45183 330/258 |
| 10,171,052 B2 * | 1/2019 | Shih | .................... | H03F 3/45475 |
| 11,405,062 B1 * | 8/2022 | Xu | ....................... | H04B 1/1607 |
| 2002/0024384 A1 | 2/2002 | Fattaruso et al. | | |
| 2014/0232516 A1 | 8/2014 | Stivoric et al. | | |

(Continued)

FOREIGN PATENT DOCUMENTS

| EP | 2980609 A1 | 2/2016 |
|---|---|---|
| KR | 20110061750 A | 6/2011 |
| WO | WO 0027029 A1 | 5/2000 |

*Primary Examiner* — Hieu P Nguyen
(74) *Attorney, Agent, or Firm* — Seed Intellectual Property Law Group LLP (57) ABSTRACT

A circuit for startup of a multi-stage amplifier circuit includes a pair of input nodes and at least two output nodes configured to be coupled to a multi-stage amplifier circuit. A startup differential stage includes a differential pair of transistors having respective control terminals coupled to the pair of input nodes, and each transistor in the differential pair of transistors has a respective current path therethrough between a respective output node and a common source terminal. The startup differential stage is configured to sense a common mode voltage drop at a first differential stage of the multi-stage amplifier circuit. Current mirror circuitry includes a plurality of transistors coupled to the common terminal of the differential pair of transistors and coupled to two output nodes of the at least two output nodes.

20 Claims, 7 Drawing Sheets

(56) References Cited

U.S. PATENT DOCUMENTS

2016/0342781 A1 11/2016 Jeon
2018/0152156 A1 5/2018 Shih

* cited by examiner

FIG. 7

MULTI-STAGE AMPLIFIER CIRCUITS AND METHODS

BACKGROUND

Technical Field

The description relates to amplifier circuits, such as fully-differential amplifier circuits of the multistage operational transconductance amplifier (briefly, OTA) type.

One or more embodiments may be applied to a charge amplifier circuit suitable for detecting charge variation in capacitive sensors.

Description of the Related Art

Amplifier circuits such as OTAs are suitable for a wide set of electronic applications.

A drawback of existing OTA circuits lies in the existence of a plurality of possible stable bias points. Such a drawback may exist irrespective of the kind of transistors (e.g., PMOS or NMOS) used for an input differential-pair of the OTA.

For instance, there is an undesired stable bias point value when input and output common mode nodes are at a same constant value (e.g., $VCM_{IN}=VCM_{OUT}=0$ for the NMOS input differential-pair or $VCM_{IN}=VCM_{OUT}=VDD$ for the PMOS input differential-pair). Such an undesired bias point value can, for instance, be carried from the output to the input nodes of the OTA via a feedback circuit branch, in particular a resistive feedback branch.

As a result, a start-up phase of an OTA can be relevant in order to counter any risk of latching the amplifier in undesired bias conditions.

Even with an adequate start-up phase, a perturbation on the virtual ground of a multistage OTA during its normal operations, can still result in an undesired shutdown of the amplifier stage.

BRIEF SUMMARY

Technical benefits of one or more embodiments contribute in overcoming the aforementioned drawbacks.

According to one or more embodiments, such technical benefits can be achieved by means of a circuit having the features set forth following greater detail herein. A startup circuit for a multi-stage amplifier circuit can be exemplary of such a circuit.

One or more embodiments may relate to a corresponding multi-stage amplifier circuit.

One or more embodiments may relate to a corresponding method. A start-up method for an OTA may be exemplary of such a circuit.

One or more embodiments may counter performance deterioration due to process-voltage-temperature (briefly, PVT) circuit variations.

One or more embodiments may facilitate increasing circuit robustness against non-idealities, such as noise and mismatch, for instance, which may otherwise reduce accuracy.

One or more embodiments may provide an effective improvement over existing solutions using a relatively simple arrangement.

One or more embodiments facilitate providing a start-up network without loss of performances.

One or more embodiments may facilitate providing a compact, area-saving solution.

In at least one embodiment, a startup circuit for a multi-stage amplifier circuit having a cascade of differential stages including at least a first differential stage is provided. The startup circuit includes a pair of input nodes and at least two output nodes configured to be coupled to the multi-stage amplifier circuit. A startup differential stage includes a differential pair of transistors having respective control terminals coupled to the pair of input nodes, with each transistor of the differential pair of transistors having a respective current path therethrough between a respective output node of the at least two output nodes and a common source terminal. The startup differential stage is configured to sense a common mode voltage drop at the first differential stage of the multi-stage amplifier circuit. Current mirror circuitry includes a plurality of transistors in a current mirror arrangement coupled to the common terminal of the differential pair of transistors and coupled to two output nodes of the at least two output nodes. The at least two output nodes are configured to be coupled at least to the first differential stage of the multi-stage amplifier circuit. The current mirror circuitry is configured to perform current mirroring of a current variation at the common source of the startup differential stage, and compensating the sensed common mode voltage drop at the first differential stage of the multi-stage amplifier circuit as a result.

In at least one embodiment, a multi-stage amplifier is provided that includes a pair of first input nodes and a pair of first output nodes. A cascade of differential stages includes at least a first differential stage coupled to the pair of first input nodes and a second differential stage coupled to the pair of first output nodes. A startup circuit is coupled at least to the first differential input stage. The startup circuit includes a pair of second input nodes and at least two second output nodes coupled to the first differential stage. A startup differential stage is included in the startup circuit and includes a first differential pair of transistors having respective control terminals coupled to the pair of second input nodes, with each transistor of the first differential pair of transistors having a respective current path therethrough between a respective second output node of the at least two second output nodes and a common source terminal. The startup differential stage is configured to sense a common mode voltage drop at the first differential stage of the multi-stage amplifier circuit. The startup circuit further includes current mirror circuitry that includes a plurality of transistors in a current mirror arrangement coupled to the common terminal of the first differential pair of transistors and coupled to two second output nodes of the at least two second output nodes. The current mirror circuitry is configured to perform current mirroring of a current variation at the common source of the startup differential stage, and to compensate the sensed common mode voltage drop at the first differential stage.

In at least one embodiment, a method of operating of a multi-stage amplifier circuit is provided that includes: sensing, via a startup differential stage of the multi-stage amplifier circuit, a common mode voltage drop at a first differential stage of a cascade of differential stages of the multi-stage amplifier circuit, the first differential stage coupled to a pair of first input nodes, the multi-stage amplifier circuit further including a second differential stage coupled to a pair of first output nodes, the startup differential stage including a first differential pair of transistors having respective control terminals coupled to a pair of second input nodes, each transistor of the first differential pair of transistors having a respective current path therethrough between a respective second output node and a common source terminal; performing current mirroring of a current variation at the common source of the startup differential stage; and compensating, as a result of the current mirroring, the sensed common mode voltage drop at the first differential stage of the multi-stage amplifier circuit.

BRIEF DESCRIPTION OF THE SEVERAL VIEWS OF THE DRAWINGS

One or more embodiments will now be described, by way of non-limiting example only, with reference to the annexed Figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
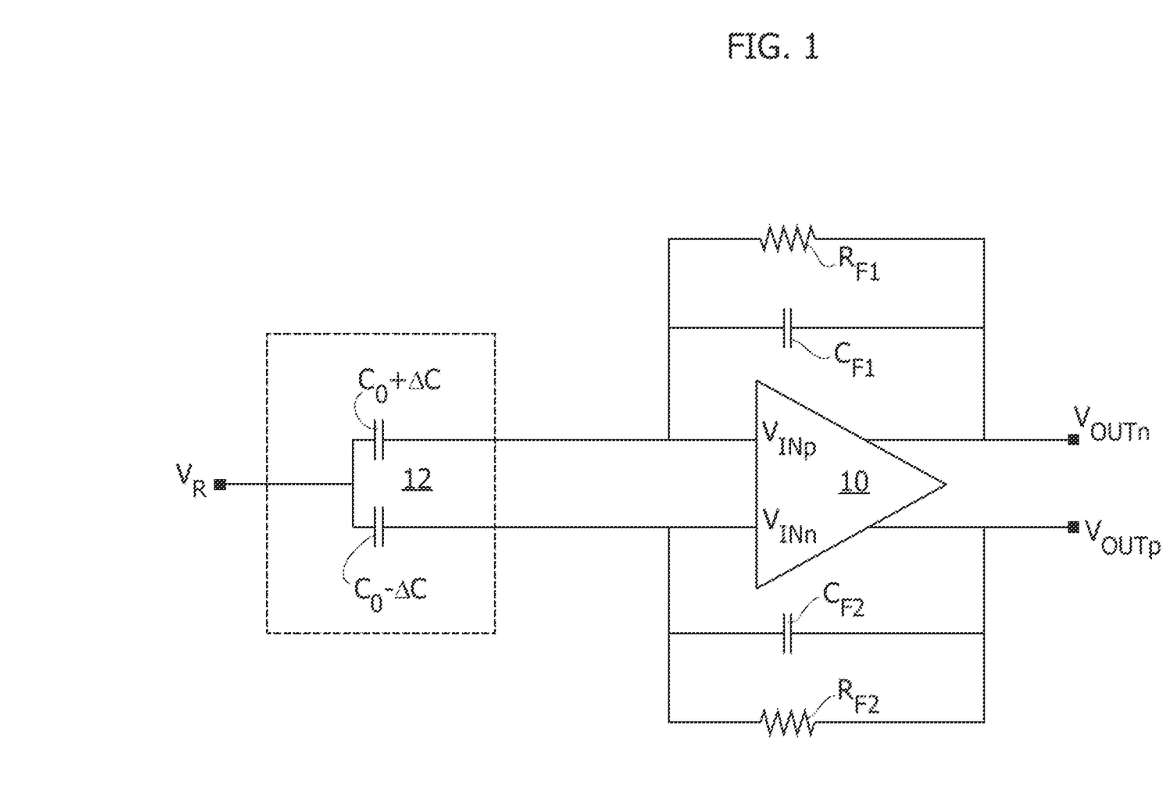
FIG. 1 is an exemplary diagram of a charge amplifier.

FIG. 1 shows an exemplary diagram of a charge amplifier circuit 10 which may comprise:

a bias node $V_R$ configured to be coupled to some voltage source, in a way per se known;

a capacitive sensor 12 coupled to the reference node $V_R$ and having a differential, variable capacitance whose value is $C_0 \pm \Delta C$; and an operational transconductance amplifier (OTA) 10, which may have:

a non-inverting input node $V_{INp}$ connected to the sensor 12 and coupled to a first output node $V_{OUTn}$ via a first feedback branch comprising a first RC network $R_{F1}$, $C_{F1}$; and an inverting input node $V_{INn}$ connected to the sensor 12 and coupled to a second output node $V_{OUTp}$ via a second feedback branch comprising a second RC network $R_{F2}$, $C_{F2}$.

An input $VCM_{IN}$, respectively output $VCM_{OUT}$, common mode voltage level of the OTA 10 As exemplified in FIG. 1 can be expressed as:

$$VCM_{IN} = \frac{V_{INp} + V_{INn}}{2}$$

$$VCM_{OUT} = \frac{V_{OUTp} + V_{OUTn}}{2}$$

Due to the presence of feedback RC networks $R_{F1}$, $C_{F1}$, $R_{F2}$, $C_{F2}$, it may be desirable to have equal input and output common mode voltage levels, that is $VCM_{IN} = VCM_{OUT} = VCM$.

Figure 2:
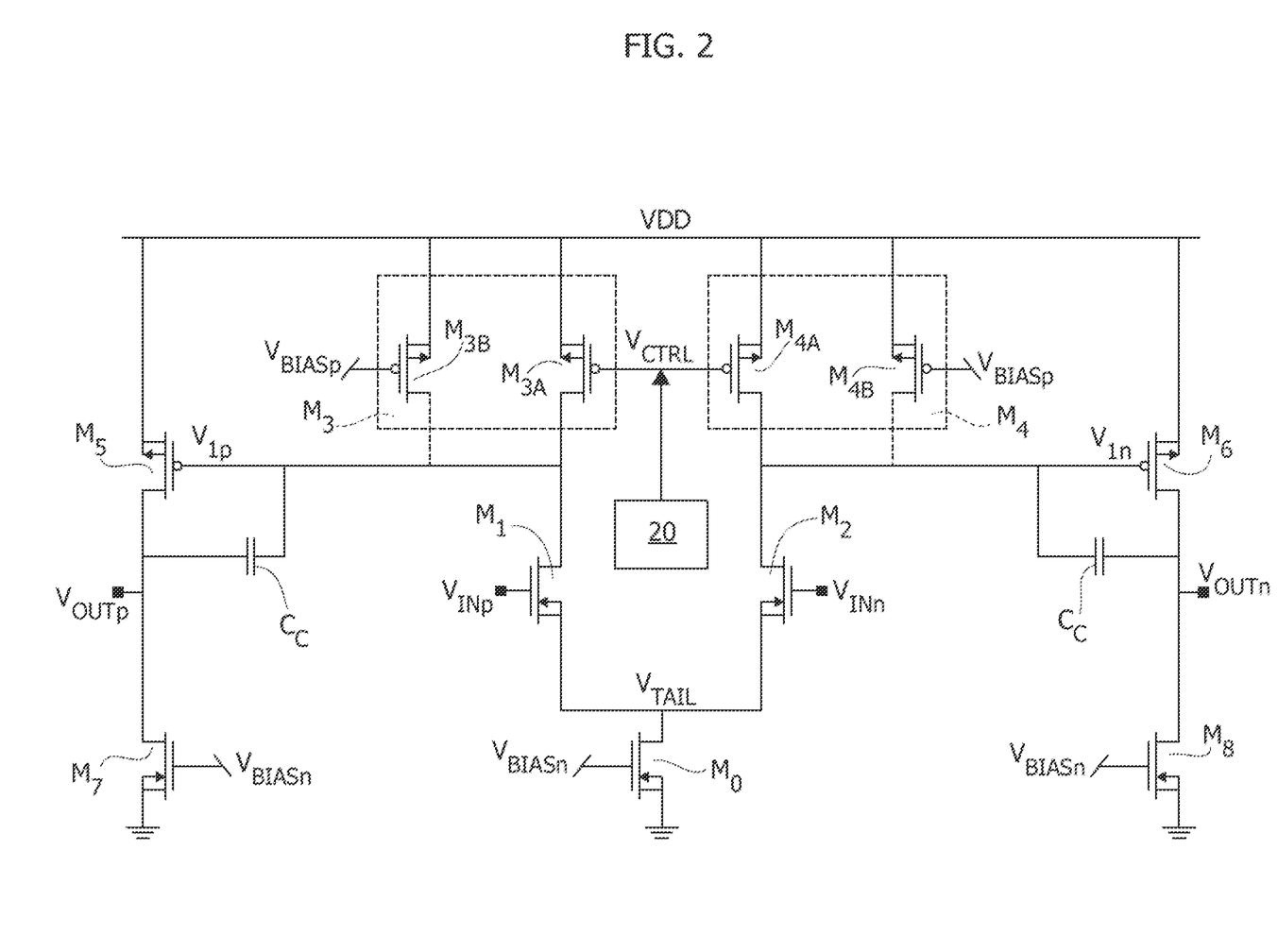
FIG. 2 is an exemplary circuit diagram of an operational transconductance amplifier.
Figure 3:
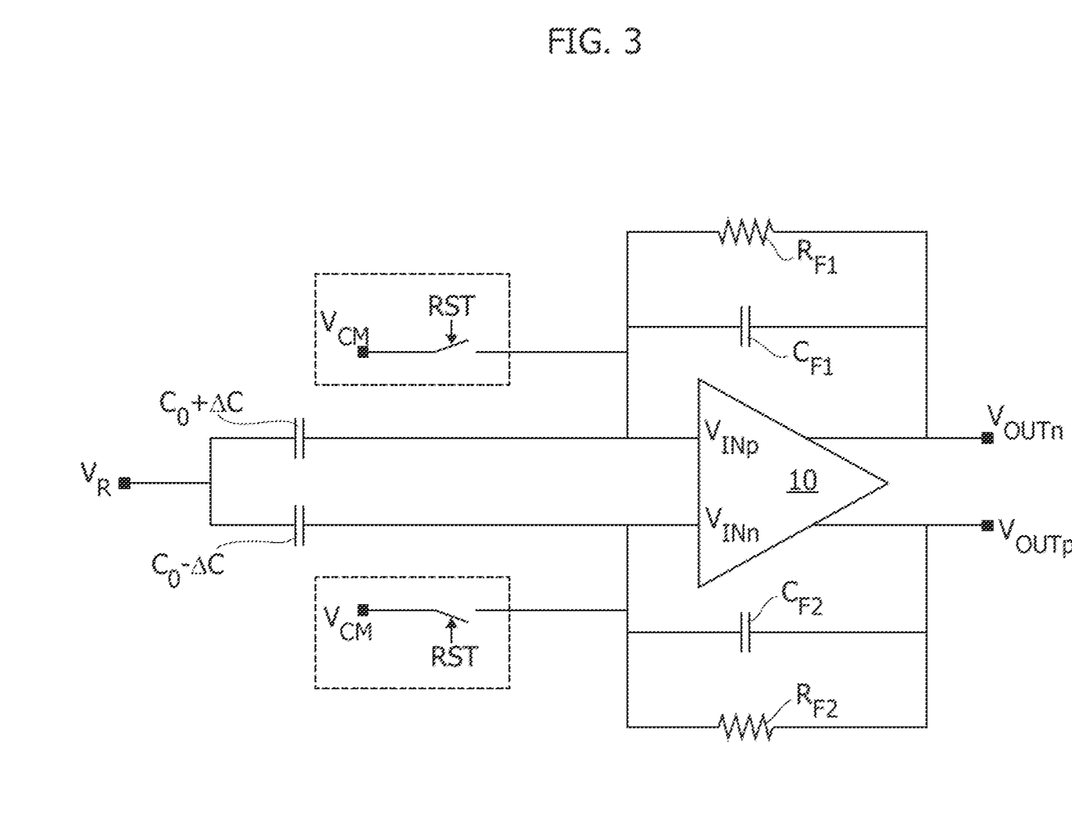
FIG. 3 is an exemplary diagram of a charge amplifier with reset switches on its virtual ground.

As exemplified in FIGS. 2 and 3, a circuit diagram of an OTA 10 as exemplified in FIG. 1 can comprise a multi-stage arrangement of electronic transistors.

For the sake of simplicity, embodiments are discussed herein with reference to a multi-stage arrangement comprising two (differential) stages, being otherwise understood that such a number of stages is purely exemplary and in no way limiting, as one or more embodiments may notionally comprise any number of stages.

For the sake of simplicity, one or more embodiments are discussed in the following mainly with respect to an OTA circuit implemented using NMOS transistor as differential-pair, being otherwise understood that such a type of transistor technology is purely exemplary and in no way limiting. One or more embodiments may use PMOS or any other kind of transistor technology.

As exemplified in FIG. 2, a two-stage OTA circuit 10 comprises an arrangement of, e.g., NMOS, transistors, the circuit arrangement comprising:

a pair of differential input nodes $V_{INp}$, $V_{INn}$ of the OTA 10;

a first differential stage comprising a first differential pair of transistors $M_1$, $M_2$ having a respective current path between a respective drain terminal and a common source terminal $V_{TAIL}$, the input nodes of the OTA 10 coupled to the respective control nodes $V_{INp}$, $V_{INn}$ of the first differential pair of transistors $M_1$, $M_2$;

at plurality of current generators, e.g., at least three current generators $M_0$, $M_7$, $M_8$ comprising transistors configured to mirror a "tail" current at the common source terminal $V_{TAIL}$ of the first differential pair of transistors $M_1$, $M_2$;

a second differential stage comprising a second differential pair of transistors $M_5$, $M_6$ having respective control nodes $V_{1p}$, $V_{1n}$ coupled to respective drain terminals of the first differential pair of transistors $M_1$, $M_2$, the transistors $M_5$, $M_6$ having a respective channel path between a respective drain node coupled to a bias voltage VDD and respective output nodes $V_{OUTp}$, $V_{OUTn}$; the respective output nodes $V_{OUTp}$, $V_{OUTn}$ of the transistors $M_5$, $M_6$ are coupled to their respective control nodes $V_{1p}$, $V_{1n}$ via a respective feedback capacitor $C_C$;

two active load stages $M_3$, $M_4$ coupled to drain terminals of the first differential pair of transistors $M_1$, $M_2$—that is to the control terminals $V_{1p}$, $V_{1n}$ of the second differential pair of transistors $M_5$, $M_6$—and to a reference/bias voltage VDD; each active load stage $M_3$, $M_4$ comprises a respective pair of first transistors $M_{3A}$, $M_{4A}$ and second transistors $M_{3B}$, $M_{4B}$, wherein: i) the control terminal of first transistors $M_{3A}$, $M_{4A}$ is connected to a control node $V_{CTRL}$ of the respective active stage M3, M4, and ii) respective second transistors $M_{3B}$, $M_{4B}$ are coupled to the bias node VDD and configured to operate as current generators of a reference current; and an output common mode feedback (OCMFB) stage 20 coupled to the control terminal $V_{CTRL}$ of the two active load stages $M_3$, $M_4$, the OCMFB stage 20 configured to facilitate stability of a bias point chosen by design, e.g., a reference common mode voltage level VCM=$VCM_0$.

In one or more embodiments, in a manner per se known to those of skill in the art, an arrangement of active loads $M_3$, $M_4$ as exemplified in FIG. 2 can facilitate compensation of the common-mode feedback loop and current savings on the second, output stage of the OTA circuit.

In addition to the selected stable common mode voltage level $VCM_0$, the circuit of FIG. 2 can have a second, parasitic, stable common mode voltage level such as VCM=0 Volts. This may result from nodes $V_{1p}$ and $V_{1n}$—when the input nodes are grounded, that is $V_{INp}=V_{INn}=0$ Volts—being "pulled up" to the bias voltage level VDD by the second transistors $M_{3B}$, $M_{4B}$ of the active loads $M_3$, $M_4$ (whose control nodes are not driven by the OCMFB network 20). Consequently, also output nodes can be grounded, that is $V_{OUTp}=V_{OUTn}=0$ Volts, with the parasitic value becoming the common mode voltage level as a result. As mentioned, this parasitic bias point can be carried to the input nodes of the OTA as exemplified in FIG. 1 via the feedback branches, in particular via feedback resistances $R_{F1}$ and $R_{F2}$, introducing a positive common mode feedback and latching the circuit in the state $VCM_{IN}=VCM_{OUT}=0$ Volts.

A way of countering the risk of latching the OTA on the parasitic stable point involves introducing a start-up phase comprising a reset phase in order to force the input nodes $V_{INp}$, $V_{INn}$ of the OTA 10 to the chosen common mode voltage level, e.g., VCM=$VCM_0$. As exemplified in FIG. 3, this may involve providing the OTA circuit 10 of common-mode nodes VCM and coupling a pair of switches S1, S2 between such common mode nodes VCM and the input nodes of the OTA 10, the switches configured to be driven by a reset signal RST from a start-up-phase logic (not visible in the Figure).

As often the case in various application, in particular in micro-electro-mechanical systems (MEMS), common mode stimulation can still take place on the virtual ground of the OTA during normal operation, with this event possibly resulting in shutdown of the amplifier 10.

Figure 4:
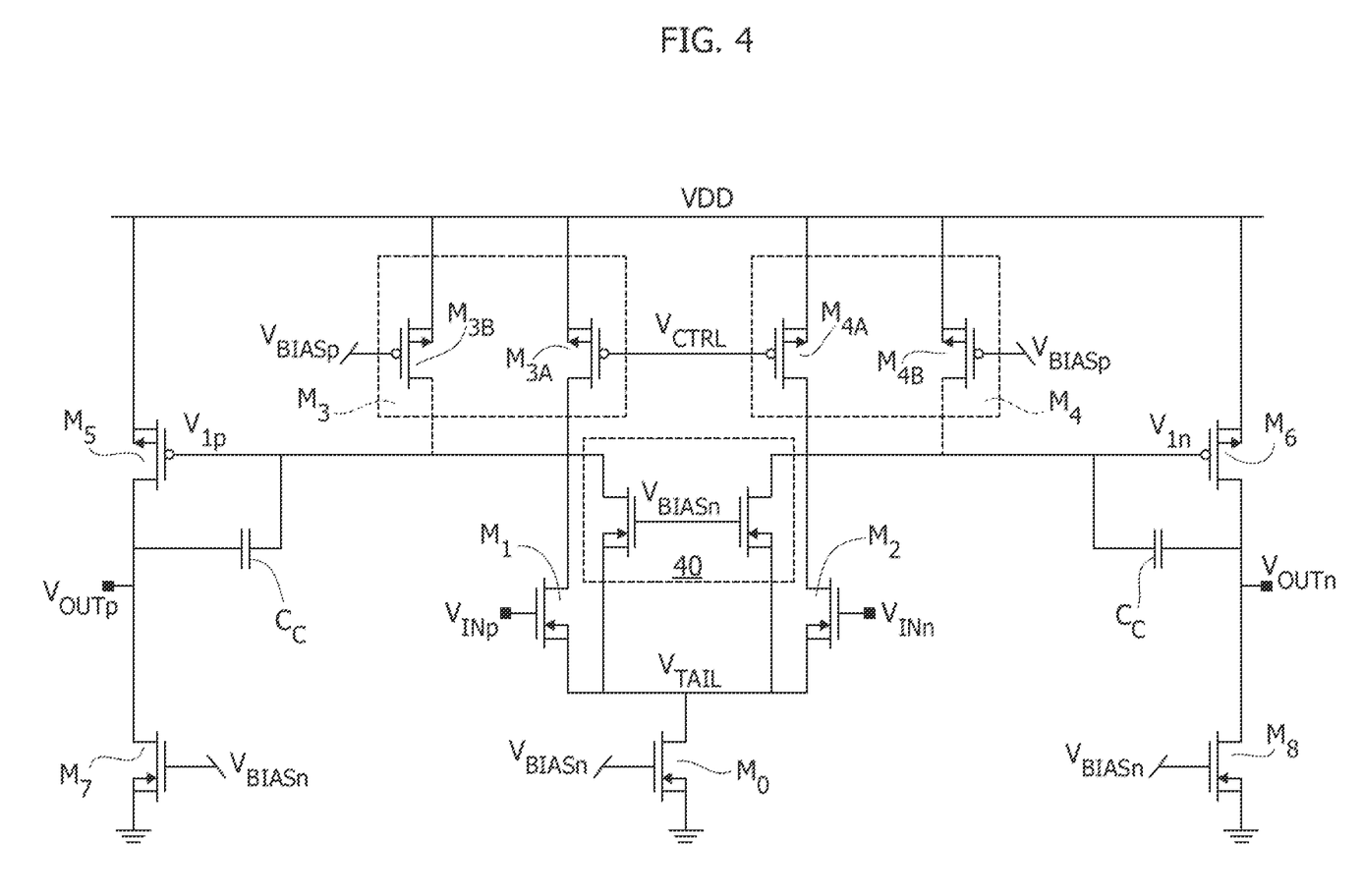
FIG. 4 is an exemplary circuit diagram of an operational transconductance amplifier having a start-up circuit portion.

A first approach to these issues may involve introducing a start-up circuit 40, as exemplified in FIG. 4. In the example considered, the start-up circuit 40 may comprise a pair of startup transistors $M_{9A}$, $M_{9B}$, e.g., using NMOS technology, having respective control terminals coupled therebetween and to a biasing node $V_{BIASn}$, the pair of startup transistors $M_{9A}$, $M_{9B}$ having respective current paths therethrough between a respective drain terminal coupled to the respective control terminal $V_{1p}$, $V_{1n}$ of the second differential pair $M_5$, $M_6$ and the common source terminal $V_{TAIL}$ of the first differential pair of transistors $M_1$, $M_2$.

As exemplified in FIG. 4, the start-up circuit 40 is designed so that the startup transistors $M_{9A}$, $M_{9B}$ are:

in a first, e.g., OFF-state, when the input nodes $V_{INp}$, $V_{INn}$ of the OTA 10 are biased at the chosen bias point, e.g., VCM=$VCM_0$; and in a second, e.g., ON-state, when a common mode perturbation causes a voltage drop at the input nodes $V_{INp}$, $V_{INn}$ of the OTA 10, so that when the common source node $V_{TAIL}$ of the first differential pair M1, M2 "follows" this drop, a current flow travels in the start-up circuit transistors $M_{9A}$, $M_{9B}$, this current flow acting as a "pull-down" for the control terminals $V_{1p}$, $V_{1n}$ of the second differential pair of transistors $M_5$, $M_6$, balancing the "pull-up" by the respective second transistors $M_{3B}$, $M_{4B}$ of the active loads $M_3$, $M_4$.

Optionally, the OCMFB circuit 20 can be also present (although not visible in FIG. 4) in addition to the startup circuit 40. In such a case, the startup circuit 40 is effective as a function of what portion of bias current is controlled by the OCMFB circuit 20 driving first transistors $M_{3A}$, $M_{4A}$ of the active load stages $M_3$, $M_4$. For instance, a low current managed by the OCMFB circuit 20 may result in an easier stabilization and a lower current on the output branches of the OTA 10, while at the same time posing constrains to the start-up circuit 40, in particular in terms of high conductivity to counter the pull-up effect of the second transistors $M_{3B}$, $M_{4B}$ of the active load stages $M_3$, $M_4$. These constrains may present cost in terms of area occupancy of the start-up circuit, which may take from 50% to 100% of the dimension of the input differential pair M1, M2. Maintaining the start-up circuit 40 sufficiently highly conductive over any PVT situation may result in leavening the startup circuit 40 turned on also when the correct bias point is recovered from any given input common mode variation, with a negative impact on the input transconductance of the stage 10. This may lead to a subsequent reduction of the performances of the OTA 10 in terms of bandwidth and noise, for instance.

Figure 5:
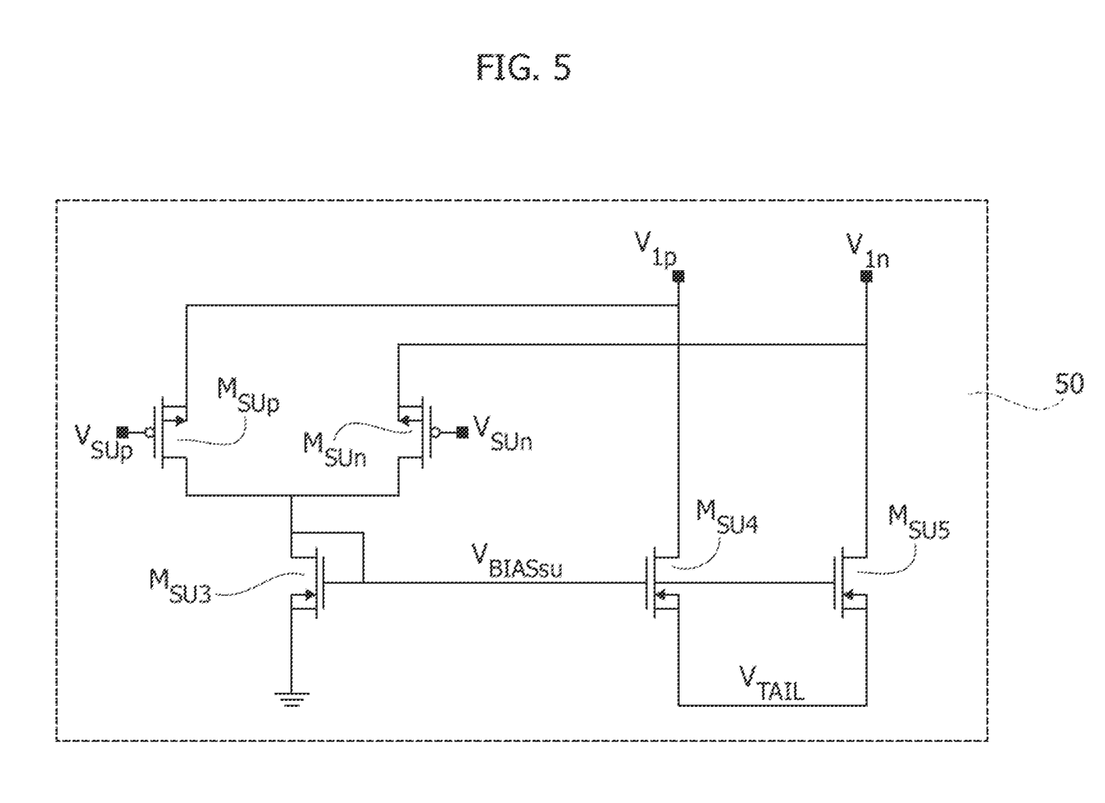
FIG. 5 is a circuit diagram exemplary of one or more embodiments a startup circuit portion.

As exemplified in FIG. 5, an improved start-up circuit 50, e.g., in NMOS technology, which may be used in place of circuit 40, comprises:

a startup differential stage $M_{SU1}$, $M_{SU2}$, having a pair of input nodes $V_{SUp}$, $V_{SUn}$ and a pair of output nodes $V_{1p}$, $V_{1n}$ configured to be coupled to the control terminals $V_{1p}$, $V_{1n}$ of the second differential pair of transistors $M_5$, $M_6$ of the OTA 10, the startup differential stage comprising a differential pair of transistors $M_{SU1}$, $M_{SU2}$ having respective control terminals connected to the input nodes $V_{SUp}$, $V_{SUn}$ of the startup differential stage, the differential pair of transistors $M_{SU1}$, $M_{SU2}$ having a respective current path therethrough between a respective drain node, at the output node of the startup differential stage, and a common source node;

a further pair of transistors $M_{SU4}$, $M_{SU5}$, having respective control terminals coupled to a biasing node $V_{BIASsu}$ and having respective current paths therethrough between the output nodes $V_{1p}$, $V_{1n}$ of the startup differential circuit and the common source node $V_{TAIL}$ of the first differential pair of transistors $M_1$, $M_2$ of the first stage of the OTA 10; and a current mirror transistor $M_{SU3}$ coupling the common source node of the start-up differential pair with the control terminals of the further pair of transistors $M_{SU4}$, $M_{SU5}$.

As exemplified in FIG. 5, when there is a common mode voltage drop at the input nodes $V_{INn}$, $V_{INp}$ of the OTA 10, the control terminals $V_{1p}$, $V_{1n}$ of the second differential pair of transistors $M_5$, $M_6$ are "pulled-up" to a higher voltage level, leading to a current flowing through start-up differential transistors $M_{SU1}$ and $M_{SU2}$; this can increase their respective bias voltage $V_{GS}$, changing both the voltage level at the control terminals $V_{INp}$, $V_{INn}$ voltage and the voltage level at the common source terminal. As a result, such a change during the common mode perturbation is injected as a current in the diodes $M_{SU3}$ (e.g., using a current-reuse approach) and mirrored thereby and via the further transistors $M_{SU4}$ and $M_{SU5}$ back to the control terminals $V_{1p}$ and $V_{1n}$ of the second differential pair of transistors $M_5$, $M_6$, re-balancing their input common-mode variation. This is indicative of an increase of the overall pull-down effectiveness of the start-up network 50.

In one or more embodiments as exemplified in FIG. 5, the mirroring ratio between $M_{SU3}$ and the pair $M_{SU4}$, $M_{SU5}$ can be used as free parameter to optimize dimension of the transistors.

Re-balancing the second differential pair of transistors $M_5$, $M_6$ via applying a "pull-down" effect on their control terminals $V_{1p}$, $V_{1n}$ as well as on the source terminals $V_{TAIL}$ facilitates operating the start-up circuit 50 in a same manner notionally for any PVT situation. Moreover, this can be possible while using a reduced amount of (circuit) area in comparison with a solution as in FIG. 4.

Figure 6:
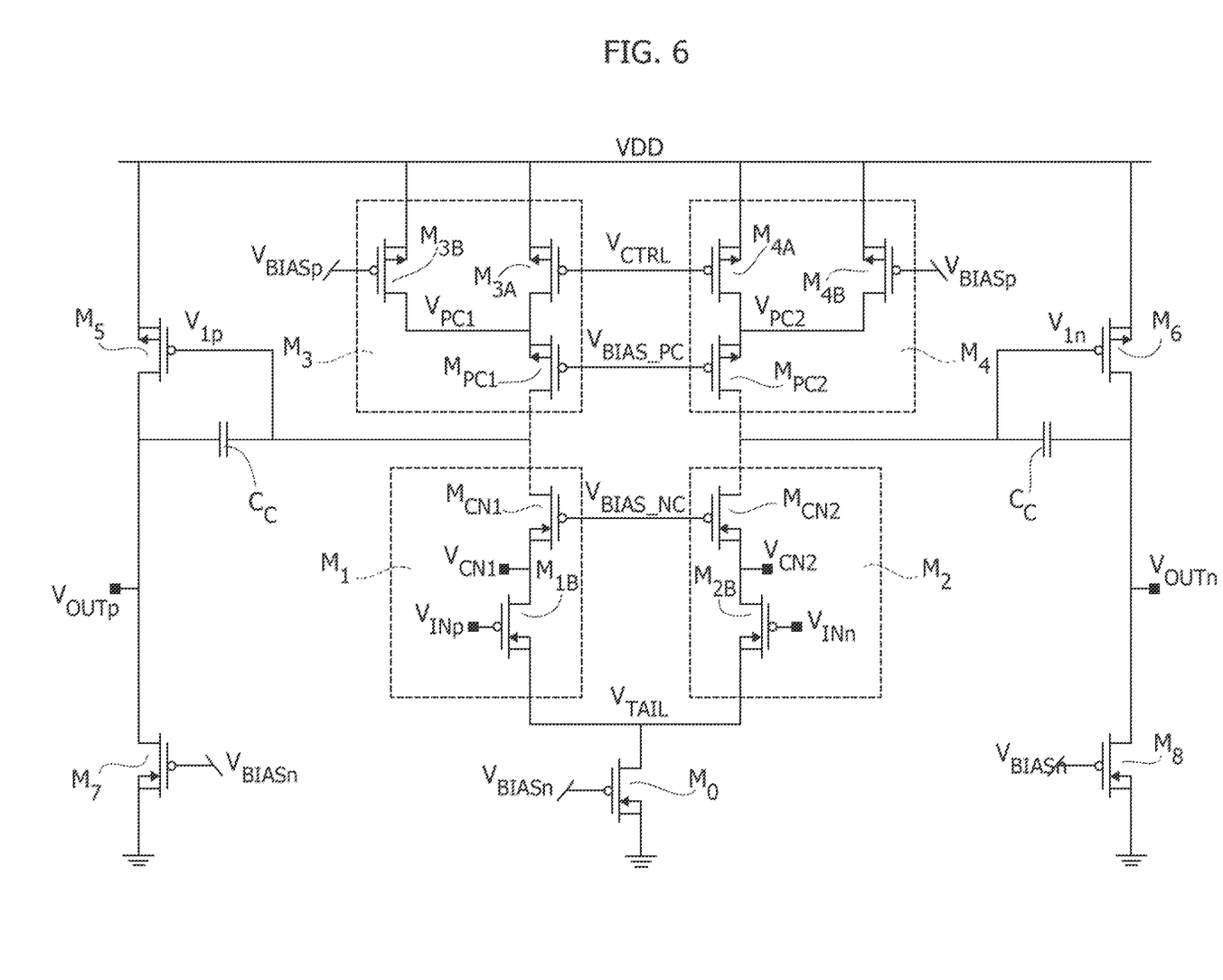
FIG. 6 is a circuit diagram exemplary of a cascoded amplifier.

As discussed in the foregoing an OTA circuit 10 as exemplified in FIG. 2 can be realized with any transistor technology. As exemplified in FIG. 6, this includes the known cascode technology, where:

the first differential stage M1, M2 is implemented using a pair of cascode arrangements of a respective common-emitter stage $M_{NC1}$, $M_{NC2}$, feeding into a respective common-base stage $M_{1s}$, $M_{2s}$ with a respective differential cascode node $V_{CN1}$, $V_{CN2}$ interposed therebetween; and in the two active loads M3, M4, the first transistors $M_{3A}$, $M_{4A}$ are implemented using a pair of cascode arrangements of a respective common-emitter stage $M_{PC1}$, $M_{PC2}$ feeding into a respective common-base stage $M_{3As}$, $M_{4As}$, with a respective cascode node $V_{CP1}$, $V_{CP2}$ interposed therebetween.

Figure 7:
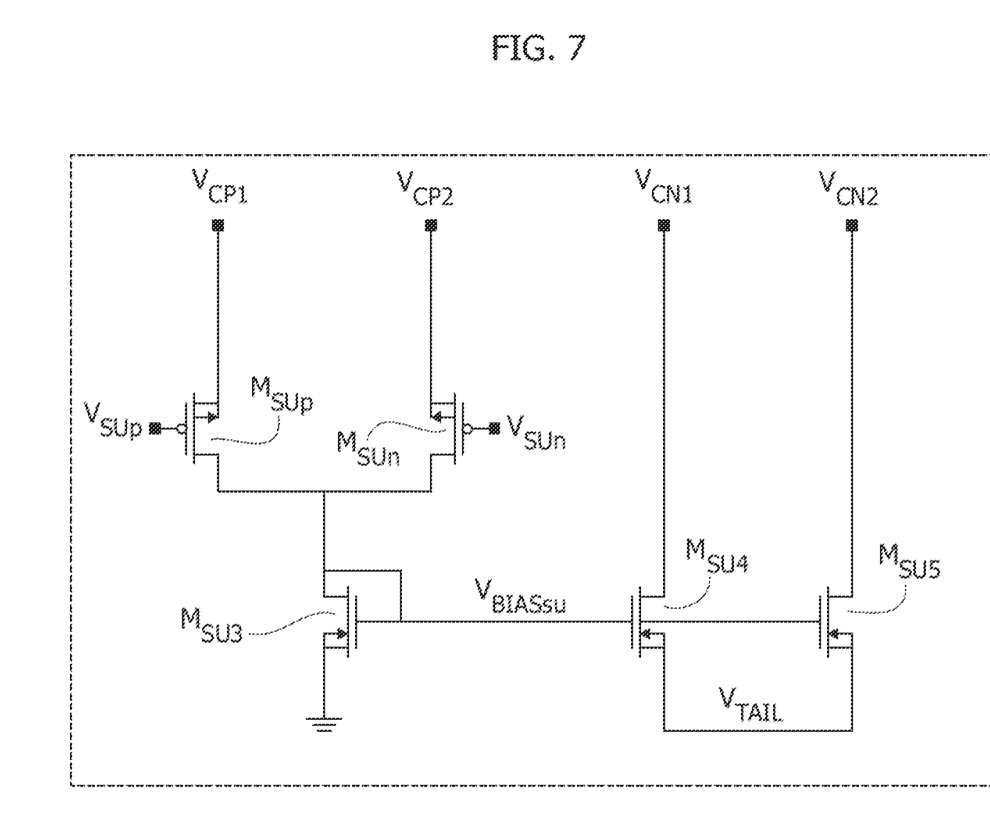
FIG. 7 is a circuit diagram exemplary of alternative embodiments of FIG. 5.

FIG. 7 is a circuit diagram of an alternative start-up circuit 70 suitable for use in combination with the cascode implementation (see FIG. 6) of the OTA 10.

As exemplified in FIG. 7, the cascode start-up circuit 70 may comprise:

a startup differential stage $M_{SU1}$, $M_{SU2}$, having a pair of input nodes $V_{SUp}$, $V_{SUn}$ and a pair of output nodes $V_{CP1}$, $V_{CP2}$ configured to be coupled to the control terminals $V_{1p}$, $V_{1n}$ of the cascode nodes of the first transistors of the active loads M3, M4 of the OTA 10, the startup differential stage comprising a differential pair of transistors $M_{SU1}$, $M_{SU2}$ having respective control terminals connected to the input nodes $V_{SUp}$, $V_{Sun}$ of the startup differential stage, the differential pair of transistors $M_{SU1}$, $M_{SU2}$ having a respective current path therethrough between a respective drain node, at the output node of the startup differential stage, and a common source node;

a further pair of transistors $M_{SU4}$, $M_{SU5}$, having respective control terminals coupled to a biasing node $V_{BIASsu}$ and having respective current paths therethrough between differential cascode nodes $V_{CP1}$, $V_{CP2}$ and the common source node $V_{TAIL}$ of the first differential pair of transistors $M_1$, $M_2$ of the first stage of the OTA 10; and a current mirror transistor $M_{SU3}$ coupling the common source node of the start-up differential pair $M_{SU1}$, $M_{SU2}$ with the control terminals of the further pair of transistors $M_{SU4}$, $M_{SU5}$.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

A startup circuit (50; 70) for a multi-stage amplifier circuit (10) may be summarized as including a cascade of differential stages including at least a first differential stage ($M_1$, $M_2$), the startup circuit (50; 70) including: a pair of input nodes ($V_{SUp}$, $V_{SUn}$) and at least two output nodes ($V_{1p}$, $V_{1n}$; $V_{CP1}$, $V_{CP2}$, $V_{CN1}$, $V_{CN2}$) configured to be coupled to said multi-stage amplifier circuit (10), a startup differential stage including a differential pair of transistors ($M_{SU1}$, $M_{SU2}$) having respective control terminals coupled to said pair of input nodes ($V_{SUp}$, $V_{SUn}$) of the circuit (50; 70), each transistor ($M_{SU1}$) in said differential pair of transistors ($M_{SU1}$, $M_{SU2}$) having a respective current path therethrough between a respective output node ($V_{1p}$, $V_{1n}$, $V_{CP1}$, $V_{CP2}$) in said at least two output nodes ($V_{1p}$, $V_{1n}$; $V_{CP1}$, $V_{CP2}$, $V_{CN1}$, $V_{CN2}$) and a common source terminal, the startup differential stage configured to sense ($M_{SU1}$, $M_{SU2}$) a common mode voltage drop at said first differential stage ($M_1$, $M_2$) of said multi-stage amplifier circuit (10), current mirror circuitry ($M_{SU3}$, $M_{SU4}$, $M_{SU5}$) including a plurality of transistors in a current mirror arrangement coupled to said common terminal of said first differential pair of transistors ($M_{SU1}$, $M_{SU2}$) and having two output nodes ($V_{1p}$, $V_{1n}$; $V_{CN1}$, $V_{CN2}$) in said at least two output nodes ($V_{1p}$, $V_{1n}$; $V_{CP1}$, $V_{CP2}$, $V_{CN1}$, $V_{CN2}$), wherein at least two output nodes ($V_{1p}$, $V_{1n}$; $V_{CN1}$, $V_{CN2}$) are configured to be coupled at least to said first differential stage ($M_1$, $M_2$) of said multi-stage amplifier circuit (10), wherein said current mirror circuitry ($M_{SU3}$, $M_{SU4}$, $M_{SU5}$) is configured to perform current mirroring of a current variation at the common source of said startup differential stage, compensating said sensed common mode voltage drop at said first differential stage ($M_1$, $M_2$) of said multi-stage amplifier circuit (10) as a result.

Said at least two output nodes ($V_{1p}$, $V_{1n}$; $V_{CP1}$, $V_{CP2}$, $V_{CN1}$, $V_{CN2}$) may include two output nodes ($V_{1p}$, $V_{1n}$), and wherein said two output nodes of said current mirror circuitry ($M_{SU3}$, $M_{SU4}$, $M_{SU5}$) are each coupled to a respective one of said output nodes of the first differential pair of transistors ($M_{SU1}$, $M_{SU2}$).

The current mirror circuitry ($M_{SU3}$, $M_{SU4}$, $M_{SU5}$) may have a current mirroring parameter which varies as a function of respective size ratios of transistors in the plurality of transistors in current mirror circuitry ($M_{SU3}$, $M_{SU4}$, $M_{SU5}$).

A multi-stage amplifier (10), may be summarized as including a pair of input nodes ($V_{INp}$, $V_{INn}$) and a pair of output nodes ($V_{OUTp}$, $V_{OUTn}$), a cascade of differential stages ($M_1$, $M_2$, $M_5$, $M_6$) including at least a first differential stage ($M_1$, $M_2$) coupled to said pair of input nodes ($V_{INp}$, $V_{INn}$) and a further differential stage ($M_5$, $M_6$) coupled to said pair of output nodes ($V_{OUTp}$, $V_{OUTn}$), and a startup circuit (50; 70) according to any of claims 1 to 3, the startup circuit (50; 70) coupled at least to the first differential input stage (M1, M2).

Said first differential stage ($M_1$, $M_2$) may include a first differential pair of transistors with a first transistor ($M_1$) and a second transistor ($M_2$) each having a respective current path between a respective output drain terminal and a common source terminal ($V_{TAIL}$), and wherein said startup circuit (50; 70) may have a first and a second output nodes ($V_{1p}$, $V_{1n}$), the first output node ($V_{1p}$) coupled to a first output drain terminal of said first transistor ($M_1$) of the first differential pair of transistors of said first differential stage ($M_1$, $M_2$) and the second output node ($V_{1n}$) coupled to a second output drain terminal of a second transistor ($M_2$) of said first differential pair of transistors of the first differential stage ($M_1$, $M_2$).

Said first differential stage ($M_1$, $M_2$) may include a first differential pair of transistors each having a respective current path therethrough between a respective output drain terminal and a common source terminal ($V_{TAIL}$), the multi-stage amplifier may further include active load stages ($M_3$, $M_4$) coupled between said output drain terminals of the first differential stage ($M_1$, $M_2$) and input nodes of the at least one further differential stage, each active load stage ($M_3$, $M_4$) including a switch ($M_{3A}$, $M_{4A}$) and a current generator ($M_{3B}$, $M_{4B}$) coupled therebetween, and said startup circuit (50; 70) may be further coupled to at least one of said further differential stage ($M_5$, $M_6$) and said active load stages ($M_3$, $M_4$).

The first differential stage ($M_1$, $M_2$) may include a pair of cascode arrangements of a respective common-emitter stage ($M_{NC1}$, $M_{NC2}$) feeding into a respective common-base stage ($M_{1s}$, $M_{2s}$) with differential cascode nodes ($V_{CN1}$, $V_{CN2}$) interposed therebetween, and wherein said switches ($M_{3A}$, $M_{4A}$) of said active load stages ($M_3$, $M_4$) may be implemented using a pair of cascode arrangements of a respective common-emitter stage ($M_{PC1}$, $M_{PC2}$) feeding into a respective common-base stage ($M_{3As}$, $M_{4As}$) with a respective cascode node ($V_{CP1}$, $V_{CP2}$) interposed therebetween, wherein said startup circuit (50, 70) may have a first pair of output nodes ($V_{CP1}$, $V_{CP2}$) coupled to said cascode nodes ($V_{CP1}$, $V_{CP2}$) of said switches ($M_{3A}$, $M_{4A}$) of said active load stages ($M_3$, $M_4$) and a second pair ($V_{CN1}$, $V_{CN2}$) of output nodes coupled to said differential cascode nodes ($V_{CN1}$, $V_{CN2}$) of said first differential stage ($M_1$, $M_2$).

The said active load stages ($M_3$, $M_4$) may have at least one control terminal ($V_{CTRL}$) configured to drive said switches ($M_{3A}$, $M_{4A}$) in said active load stages ($M_3$, $M_4$), and wherein the multi-stage amplifier includes an output common mode feedback stage (20), OCMFB, coupled to the control terminal ($V_{CTRL}$) of the active load stages ($M_3$, $M_4$).

A method of operating of a multi-stage amplifier circuit may be summarized as including: sensing ($M_{SU1}$, $M_{SU2}$) a common mode voltage drop at said first differential stage ($M_1$, $M_2$) of said multi-stage amplifier circuit (10) via said startup differential stage configured to sense, performing current mirroring ($M_{SU3}$, $M_{SU4}$, $M_{SU5}$) of a current variation at said common source of said startup differential stage, and compensating ($V_{1p}$, $V_{1n}$; $V_{CP1}$, $V_{CP2}$, $V_{CN1}$, $V_{CN2}$), as a result of said current mirroring ($M_{SU3}$, $M_{SU4}$, $M_{SU5}$), said sensed common mode voltage drop at said first differential stage ($M_1$, $M_2$) of said multi-stage amplifier circuit (10).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A startup circuit for a multi-stage amplifier circuit having a cascade of differential stages including at least a first differential stage, the startup circuit including:
a pair of input nodes and at least two output nodes configured to be coupled to the multi-stage amplifier circuit;
a startup differential stage including a differential pair of transistors having respective control terminals coupled to the pair of input nodes, each transistor of the differential pair of transistors having a respective current path therethrough between a respective output node of the at least two output nodes and a common source terminal, the startup differential stage configured to sense a common mode voltage drop at the first differential stage of the multi-stage amplifier circuit; and
current mirror circuitry including a plurality of transistors in a current mirror arrangement coupled to the common terminal of the differential pair of transistors and coupled to two output nodes of the at least two output nodes,
wherein the at least two output nodes are configured to be coupled at least to the first differential stage of the multi-stage amplifier circuit, and
wherein the current mirror circuitry is configured to perform current mirroring of a current variation at the common source of the startup differential stage, and compensating the sensed common mode voltage drop at the first differential stage of the multi-stage amplifier circuit as a result.

2. The startup circuit of claim 1, wherein the two output nodes coupled to the current mirror circuitry are each coupled to a respective one of the output nodes of the differential pair of transistors.

3. The startup circuit of claim 1, wherein the current mirror circuitry has a current mirroring parameter which varies as a function of respective size ratios of transistors of the plurality of transistors of the current mirror circuitry.

4. The startup circuit of claim 1, wherein the current mirror circuitry includes:
a first transistor having a first conduction terminal connected to a first output node of the at least two output nodes; and
a second transistor having a first conduction terminal connected to a second output node of the at least two output nodes, the second transistor having a second conduction terminal connected to a second conduction terminal of the first transistor.

5. The startup circuit of claim 4, wherein a first transistor of the differential pair of transistors has a conduction terminal connected to the first output node, and a second transistor of the differential pair of transistors has a conduction terminal connected to the second output node.

6. The startup circuit of claim 4, wherein a first transistor of the differential pair of transistors has a conduction terminal connected to a third output node of the at least two output nodes, and a second transistor of the differential pair of transistors has a conduction terminal connected to a fourth output node of the at least two output nodes.

7. A multi-stage amplifier, comprising:
a pair of first input nodes and a pair of first output nodes;
a cascade of differential stages including at least a first differential stage coupled to the pair of first input nodes and a second differential stage coupled to the pair of first output nodes; and
a startup circuit coupled at least to the first differential input stage, the startup circuit including:
a pair of second input nodes;
at least two second output nodes coupled to the first differential stage;
a startup differential stage including a first differential pair of transistors having respective control terminals coupled to the pair of second input nodes, each transistor of the first differential pair of transistors having a respective current path therethrough between a respective second output node of the at least two second output nodes and a common source terminal, the startup differential stage configured to sense a common mode voltage drop at the first differential stage of the multi-stage amplifier circuit; and current mirror circuitry including a plurality of transistors in a current mirror arrangement coupled to the common terminal of the first differential pair of transistors and coupled to two second output nodes of the at least two second output nodes, wherein the current mirror circuitry is configured to perform current mirroring of a current variation at the common source of the startup differential stage, and to compensate the sensed common mode voltage drop at the first differential stage.

8. The multi-stage amplifier of claim 7, wherein the two second output nodes coupled to the current mirror circuitry are each coupled to a respective one of the output nodes of the first differential pair of transistors.

9. The multi-stage amplifier of claim 7, wherein the current mirror circuitry has a current mirroring parameter which varies as a function of respective size ratios of transistors of the plurality of transistors of the current mirror circuitry.

10. The multi-stage amplifier of claim 7, wherein the current mirror circuitry includes:
 a first transistor having a first conduction terminal connected to a first output node of the at least two second output nodes; and
 a second transistor having a first conduction terminal connected to a second output node of the at least two second output nodes, the second transistor having a second conduction terminal connected to a second conduction terminal of the first transistor.

11. The multi-stage amplifier of claim 10, wherein a first transistor of the first differential pair of transistors has a conduction terminal connected to the first output node, and a second transistor of the first differential pair of transistors has a conduction terminal connected to the second output node.

12. The multi-stage amplifier of claim 10, wherein a first transistor of the first differential pair of transistors has a conduction terminal connected to a third output node of the at least two output nodes, and a second transistor of the first differential pair of transistors has a conduction terminal connected to a fourth output node of the at least two output nodes.

13. The multi-stage amplifier of claim 7, wherein the first differential stage includes a second differential pair of transistors including a first transistor and a second transistor each having a respective current path between a respective output drain terminal and a common source terminal, and wherein a first output node of the at least two second output nodes is coupled to a first output drain terminal of the first transistor, and a second output node of the at least two second output nodes is coupled to a second output drain terminal of the second transistor.

14. The multi-stage amplifier of claim 7, wherein:
 the first differential stage includes a second differential pair of transistors each having a respective current path therethrough between a respective output drain terminal and a common source terminal, the multi-stage amplifier further includes active load stages coupled between the output drain terminals of the first differential stage and input nodes of the second differential stage, each active load stage including a switch and a current generator coupled therebetween, and the startup circuit is further coupled to at least one of the second differential stage or an active load stage of the active load stages.

15. The multi-stage amplifier of claim 14, wherein the first differential stage includes a pair of cascode arrangements of a respective common-emitter stage feeding into a respective common-base stage with differential cascode nodes interposed therebetween, and wherein the switches of the active load stages include a pair of cascode arrangements of a respective common-emitter stage feeding into a respective common-base stage with a respective cascode node interposed therebetween, wherein the at least two second output nodes of the startup circuit includes a first pair of second output nodes coupled to the cascode nodes of the switches of the active load stages and a second pair of second output nodes coupled to the differential cascode nodes of the first differential stage.

16. The multi-stage amplifier of claim 14, wherein the active load stages include at least one control terminal configured to drive the switches in the active load stages, and wherein the multi-stage amplifier includes an output common mode feedback stage coupled to a control terminal of the active load stages.

17. A method of operating of a multi-stage amplifier circuit, the method comprising:
 sensing, via a startup differential stage of the multi-stage amplifier circuit, a common mode voltage drop at a first differential stage of a cascade of differential stages of the multi-stage amplifier circuit, the first differential stage coupled to a pair of first input nodes, the multi-stage amplifier circuit further including a second differential stage coupled to a pair of first output nodes, the startup differential stage including a first differential pair of transistors having respective control terminals coupled to a pair of second input nodes, each transistor of the first differential pair of transistors having a respective current path therethrough between a respective second output node and a common source terminal;
 performing current mirroring of a current variation at the common source of the startup differential stage; and
 compensating, as a result of the current mirroring, the sensed common mode voltage drop at the first differential stage of the multi-stage amplifier circuit.

18. The method of claim 17, wherein the performing current mirroring includes performing the current mirroring by current mirror circuitry including a plurality of transistors in a current mirror arrangement coupled to the common terminal of the first differential pair of transistors and coupled to the second output nodes.

19. The method of claim 18, wherein the second output nodes coupled to the current mirror circuitry are each coupled to a respective one of the output nodes of the first differential pair of transistors.

20. The method of claim 18, further comprising varying a current mirroring parameter of the current mirror circuitry as a function of respective size ratios of transistors of the plurality of transistors of the current mirror circuitry.

\* \* \* \* \*